(12) United States Patent
Wang et al.

(10) Patent No.: US 11,463,046 B1
(45) Date of Patent: Oct. 4, 2022

(54) RESISTOR-CAPACITOR OSCILLATOR WITH SHARED CIRCUIT ARCHITECTURE

(71) Applicant: Artery Technology Company, Hsinchu County (TW)

(72) Inventors: Zhengxiang Wang, Suzhou (CN); Gui Feng Zhou, Chongqing (CN); Wei-Chih Chen, Hsin-Chu (TW)

(73) Assignee: Artery Technology Company, Hsinchu (TW)

( * ) Notice: Subject to any disclaimer, the term of this patent is extended or adjusted under 35 U.S.C. 154(b) by 0 days.

(21) Appl. No.: 17/516,716

(22) Filed: Nov. 2, 2021

(30) Foreign Application Priority Data

Aug. 23, 2021 (CN) .......................... 202110966700.6

(51) Int. Cl.
*H03B 5/24* (2006.01)
(52) U.S. Cl.
CPC ....... *H03B 5/24* (2013.01); *H03B 2200/0038* (2013.01)
(58) Field of Classification Search
CPC .... H03B 5/20; H03B 2200/0038; H03B 5/24; H03K 3/023; H03K 3/0231
See application file for complete search history.

(56) References Cited

U.S. PATENT DOCUMENTS

| 7,439,818 | B2 | 10/2008 | Bakker |
| 10,171,032 | B2 | 1/2019 | Wu |
| 2006/0197612 | A1* | 9/2006 | Pannizzo ............... H03K 4/502 331/16 |
| 2008/0290955 | A1* | 11/2008 | Fort ..................... H03K 3/0231 331/111 |
| 2013/0200956 | A1* | 8/2013 | Hsiao ..................... H03K 4/502 331/111 |
| 2016/0105148 | A1* | 4/2016 | Powell ..................... H03B 5/24 331/108 R |
| 2019/0149140 | A1* | 5/2019 | Han ..................... H03K 3/0231 331/8 |
| 2021/0305971 | A1* | 9/2021 | Wu ........................ H03K 3/011 |

FOREIGN PATENT DOCUMENTS

CN 103338026 B 1/2016

* cited by examiner

*Primary Examiner* — Levi Gannon
(74) *Attorney, Agent, or Firm* — Winston Hsu (57) ABSTRACT

A resistor-capacitor (RC) oscillator with shared circuit architecture includes a current mirror circuit, a comparator circuit, a bias voltage generator, and a clock buffer. The current mirror circuit utilizes a plurality of transistors to perform current control, to adjust a second current on a second current path according to a first current on a first current path. The comparator circuit includes a first transistor, a second transistor, a resistor, and a capacitor, wherein a comparison result signal generated by the comparator circuit corresponds to a voltage of the capacitor. The bias voltage generator generates a bias voltage as a comparator reference voltage between the first transistor and the resistor. The clock buffer buffers the comparison result signal to generate an output signal. The bias voltage generator at least shares the resistor with the comparator circuit, and the RC oscillator may achieve targets of low cost and high performance.

7 Claims, 6 Drawing Sheets

RESISTOR-CAPACITOR OSCILLATOR WITH SHARED CIRCUIT ARCHITECTURE

BACKGROUND OF THE INVENTION

1. Field of the Invention

The present invention is related to a clock control scheme, and more particularly, to a resistor-capacitor (RC) oscillator with shared circuit architecture.

2. Description of the Prior Art

The rapidly growing consumer market for microcontroller units (MCUs) requires cost-effective design and manufacturing. Since the RC oscillator may provide a wide range of clock frequencies to provide the system with clocks or clock the peripheral devices, the RC oscillator may be regarded as a necessary analog module. As a result, it is required to design an extremely low-cost RC oscillator to reduce the overall cost of various electronic products.

SUMMARY OF THE INVENTION

It is therefore an objective of the present invention to provide an RC oscillator with shared circuit architecture, to address above-mentioned problems.

It is another objective of the present invention to provide an RC oscillator with shared circuit architecture, to achieve an optimal performance of an electronic device without introducing a side effect or in a way that less likely to introduce a side effect.

At least one embodiment of the present invention provides an RC oscillator with shared circuit architecture, wherein the RC oscillator may include a current mirror circuit, a comparator circuit, a bias voltage generator, and a clock buffer, wherein the bias voltage generator is coupled to the comparator circuit. The current mirror circuit may include a plurality of transistors, wherein the plurality of transistors are coupled to a supply voltage. The comparator circuit may include a first transistor, a second transistor, a resistor, and a capacitor, wherein the first transistor and the second transistor are coupled to the current mirror circuit, the resistor is coupled to the first transistor, and the capacitor is coupled to the second transistor. For example, the current mirror circuit may utilize the plurality of transistors to perform current control, to adjust a second current on a second current path according to a first current on a first current path. The comparator circuit may perform comparison operations. Particularly, the first transistor is located on the first current path, and the second transistor is located on the second current path, wherein respective gate terminals of the first transistor and the second transistor are coupled to each other. The resistor is located on the first current path, and the capacitor is located on the second current path, wherein a comparison result signal generated by the comparator circuit corresponds to a voltage of the capacitor. In addition, the bias voltage generator may be arranged to generate a bias voltage as a comparator reference voltage between the first transistor and the resistor. The clock buffer may be arranged to buffer the comparison result signal to generate an output signal, wherein an output terminal of the clock buffer outputs the output signal, and is coupled to the comparator circuit to provide the output signal to the comparator circuit, for selectively resetting the voltage of the capacitor. In addition, the bias voltage generator at least shares the resistor located on the first current path with the comparator circuit.

Compared with the traditional architecture, the RC oscillator with shared circuit architecture of the present invention may achieve an excellent overall performance without introducing a side effect or in a way that less likely to introduce a side effect. In addition, implementation that is based on embodiments of the present invention may achieve targets of low cost and high performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
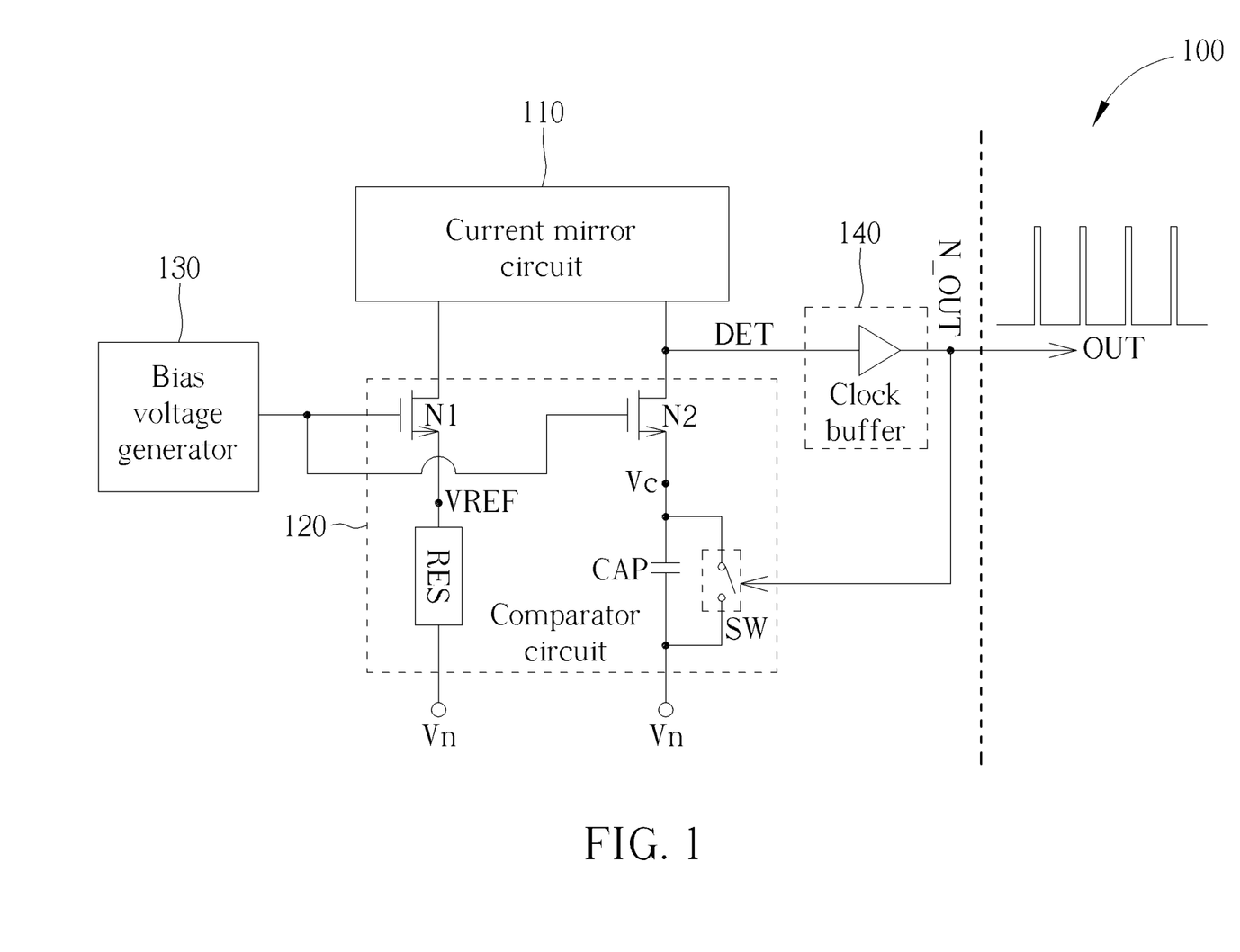
FIG. 1 is a diagram illustrating an RC oscillator with shared circuit architecture according to an embodiment of the present invention.

FIG. 1 is a diagram illustrating an RC oscillator 100 with shared circuit architecture according to an embodiment of the present invention. Most of the components in the architecture shown in FIG. may be implemented by using some types of the Metal Oxide Semiconductor Field Effect Transistor (MOSFET), such as P-type MOSFET and N-type MOSFET, but the present invention is not limited thereto. For better comprehension, the RC oscillator 100 may be operated according to a first reference voltage (e.g. a supply voltage Vp) and a second reference voltage (e.g. aground voltage Vn). For example, the ground voltage Vn may be equal to 0V (volt), but the present invention is not limited thereto.

As shown in FIG. 1, the RC oscillator 100 may include a current mirror circuit 110, a comparator circuit 120, a bias voltage generator 130, and a clock buffer 140, wherein the bias voltage generator 130 and the clock buffer 140 are coupled to the comparator circuit 120. The current mirror circuit 110 may include a plurality of transistors (not shown in FIG. 1) that are coupled to the supply voltage Vp. The comparator circuit 120 may include a first transistor and a second transistor (e.g. a transistor N1 and a transistor N2) that are coupled to the current mirror circuit 110, and may further include a resistor RES, a capacitor CAP, and a switch SW, wherein the resistor RES is coupled to the first transistor (e.g. the transistor N1), and the capacitor CAP is coupled to the second transistor (e.g. the transistor N2).

The current mirror circuit 110 may utilize the plurality of transistors to perform current control, to adjust a second current on a second current path (e.g. a current path that passes through the transistor N2 and the capacitor CAP and passes through a certain transistor in the plurality of transistors) according to a first current on a first current path (e.g. a current path that passes through the transistor N1 and the resistor RES and passes through a certain transistor in the plurality of transistors). In addition, the comparator circuit 120 may be arranged to perform comparison operations. Particularly, the first transistor (e.g. the transistor N1) is located on the first current path, and the second transistor (e.g. the transistor N2) is located on the second current path, wherein respective gate terminals of the first transistor and the second transistor are coupled to each other. The resistor RES is located on the first current path, and the capacitor CAP is located on the second current path.

Based on the architecture shown in FIG. 1, a comparison result signal DET generated by the comparator circuit 120 may correspond to a voltage of the capacitor CAP. The voltage of the capacitor CAP, such as a voltage between two terminals of the capacitor CAP, may be equal to a voltage difference between a voltage Vc on a node (which is located between the capacitor CAP and the transistor N2 on the second current path) and the ground voltage Vn (i.e. the voltage difference=Vc−Vn). Particularly, under a situation that Vn=0, the voltage of the capacitor CAP may be equal to 0. In addition, the bias voltage generator 130 may generate a bias voltage as a comparator reference voltage VREF between the first transistor (e.g. the transistor N1) and the resistor RES.

The clock buffer 140 may buffer the comparison result signal DET to generate an output signal OUT, wherein an output terminal N OUT of the clock buffer 140 may output the output signal OUT, and may be coupled to comparator circuit 120 (e.g. a control terminal of the switch SW) to provide the output signal OUT to the comparator circuit 120, for selectively resetting the voltage (Vc−Vn) of the capacitor CAP, such as the voltage Vc (under the situation that Vn=0). The RC oscillator 100 may periodically charge and discharge the capacitor CAP. For example, the RC oscillator 100 may utilize the current mirror circuit 110 to charge the capacitor CAP, and may utilize the comparator circuit 120 to determine whether to discharge the capacitor CAP. Regarding discharging of the capacitor CAP, the comparator circuit 120 (e.g. the switch SW) may selectively conduct the two terminals of the capacitor CAP according to the output signal OUT, to reset the voltage of the capacitor CAP.

For better comprehension, the current mirror circuit 110, the comparator circuit 120, and the bias voltage generator 130 may be illustrated as individual components to clearly indicate their different functions, but the present invention is not limited thereto. Please note that, the above-mentioned shared circuit architecture may include one or more sub-circuits shared by at least two components in these components, and the RC oscillator 100 with the above-mentioned shared circuit architecture may be implemented as an extremely low-cost RC oscillator. As a result, the overall cost of any electronic product using the RC oscillator 100 may be correspondingly reduced.

For example, the bias voltage generator 130 may at least share the resistor RES located on the first current path with the comparator circuit 120, and the one or more sub-circuits may include the resistor RES, but the present invention is not limited thereto. The bias voltage generator 130 may further share the first transistor (e.g. the transistor N1) located on the first current path with the comparator circuit 120, and the one or more sub-circuits may include the resistor RES and the first transistor (e.g. the transistor N1).

According to some embodiments, the bias voltage generator 130 may further share a corresponding transistor located on the first current path with the current mirror circuit 110, and the one or more sub-circuits may include the resistor RES, the first transistor (e.g. the transistor N1), and the corresponding transistor, wherein the corresponding transistor is one of the plurality of transistors.

In addition, a pulse wave including a plurality of narrow pulses appearing periodically may be illustrated on an output path starting from the output terminal N OUT of the clock buffer 140, to indicate that the output signal OUT may be a pulse wave. Particularly, the pulse wave may be arranged to generate a clock signal, but the present invention is not limited thereto. According to some embodiments, the output terminal N OUT may be coupled to a next-stage circuit (e.g. a frequency divider) for adjusting the duty cycle of the output signal OUT to be equal to or approximately equal to 50%.

Figure 2:
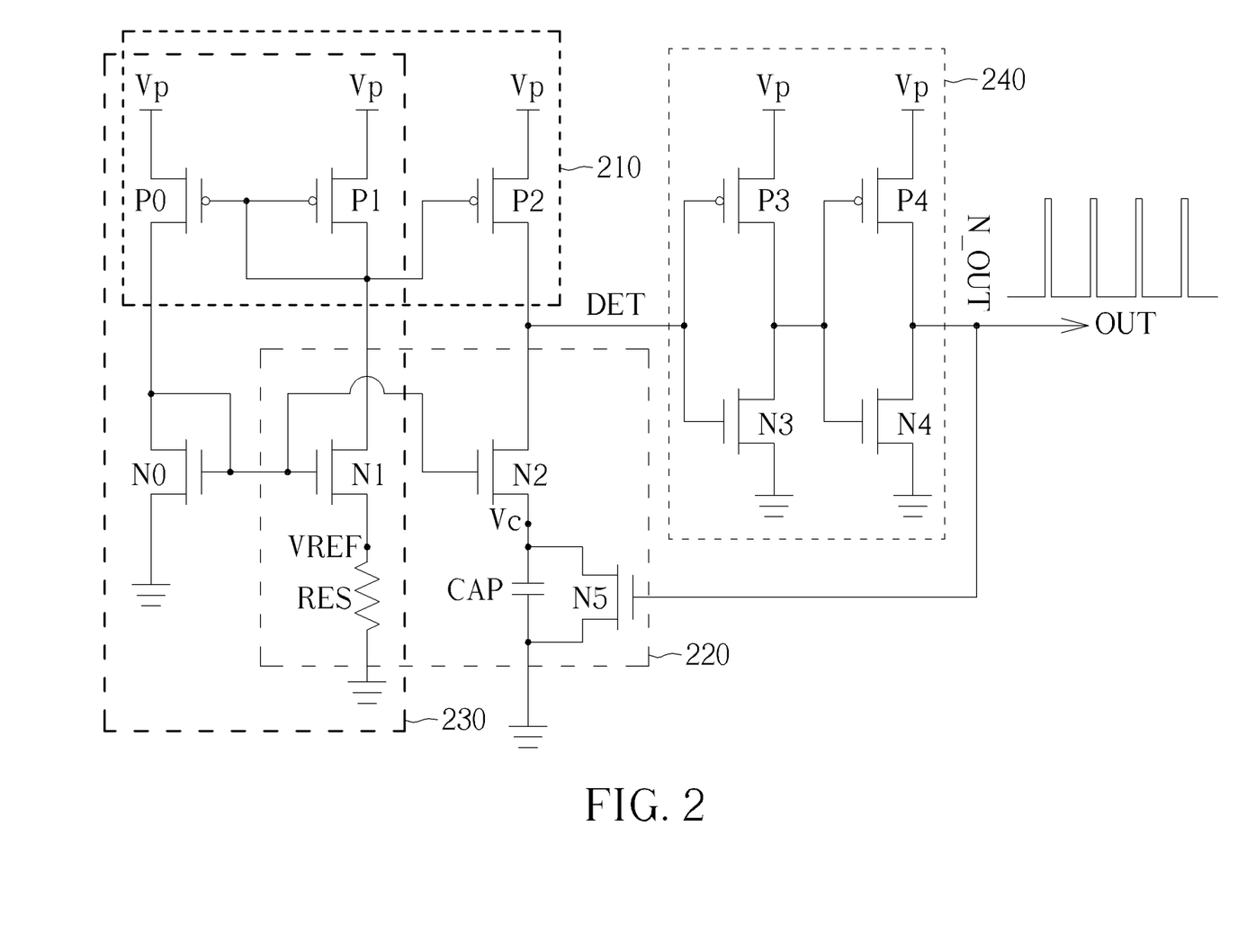
FIG. 2 is a diagram illustrating the shared circuit architecture of the RC oscillator shown in FIG. 1 according to an embodiment of the present invention.

FIG. 2 is a diagram illustrating the shared circuit architecture of the RC oscillator 100 shown in FIG. 1 according to an embodiment of the present invention. A current mirror circuit 210, a comparator circuit 220, a bias voltage generator 230, and a clock buffer 240 shown in FIG. 2 may be taken as examples of the current mirror circuit 110, the comparator circuit 120, the bias voltage generator 130, and the clock buffer 140 shown in FIG. 1, respectively.

The current mirror circuit 210 may include a first corresponding transistor located on the first current path, such as a transistor P1, wherein a first terminal of the first corresponding transistor (e.g. a drain terminal of the transistor P1) may be coupled to the first transistor (e.g. the transistor N1), and coupled to a gate terminal of the first corresponding transistor (e.g. a gate terminal of the transistor P1). The current mirror circuit 210 may further include a second corresponding transistor located on the second current path, such as a transistor P2, wherein the respective gate terminals of the first corresponding transistor and the second corresponding transistor (e.g. the transistors P1 and P2) may be coupled to each other. The current mirror circuit 210 may further include a transistor P0, and respective gate terminals of the transistor P0 and the transistor P1 may be coupled to each other. In addition, the comparator circuit 220 may include the first transistor (e.g. the transistor N1), the second transistor (e.g. the transistor N2), the resistor RES, and the capacitor CAP, and may further include a transistor N5, wherein the transistor N5 may be taken as an example of the switch SW shown in FIG. 1, a gate terminal of the transistor N5 is coupled to the output terminal OUT, and the other two terminals of the transistor N5 are coupled to two terminals of the capacitor CAP, respectively.

As shown in FIG. 2, the bias voltage generator 230 may share a part of the sub-circuits with the comparator circuit 220, and more particularly, may include the transistor N1 and the resistor RES of the comparator circuit 220, wherein the transistor N1 and the resistor RES are located on the first current path. The bias voltage generator 230 may further include another transistor (e.g. a transistor N0) located on a third current path. In addition, the bias voltage generator 230 may share a part of the sub-circuits with the current mirror circuit 210, and more particularly, may include the first corresponding transistor (e.g. the transistor P1) located on the first current path and another corresponding transistor (e.g. the transistor P0) located on the third current path, wherein respective gate terminals of the first corresponding transistor and the another corresponding transistor (e.g. the transistors P1 and P0) may be coupled to each other. In addition, a first terminal of the another transistor (e.g. a drain terminal of the transistor N0) is coupled to the another corresponding transistor (e.g. the transistor P0), and is coupled to a gate terminal of the another transistor (e.g. the gate terminal of the transistor N0). The respective gate terminals of the first transistor and the another transistor (e.g. the transistors N1 and N0) are coupled to each other. For brevity, similar descriptions for this embodiment are not repeated in detail here.

Figure 3:
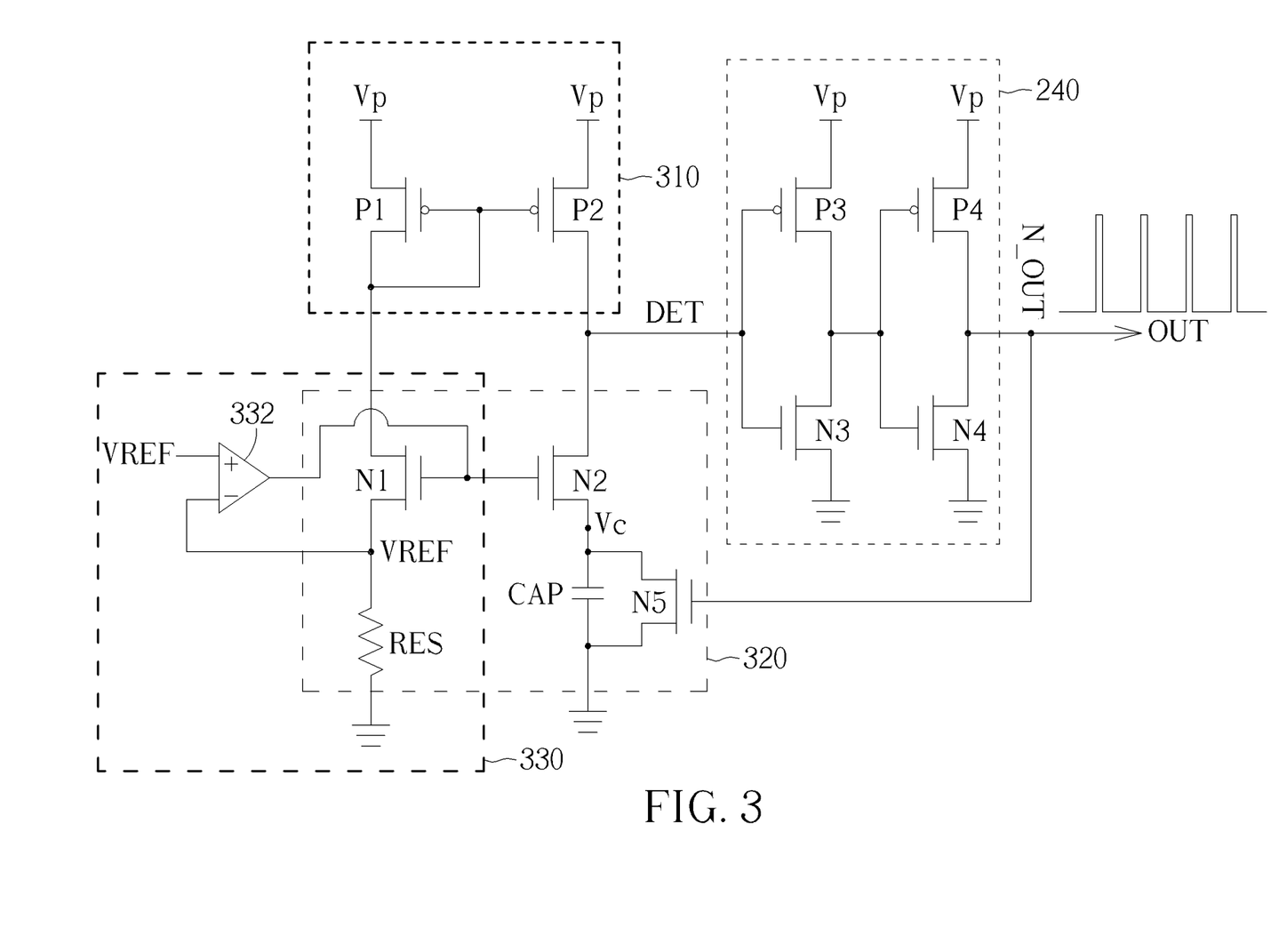
FIG. 3 is a diagram illustrating the shared circuit architecture of the RC oscillator shown in FIG. 1 according to another embodiment of the present invention.

FIG. 3 is a diagram illustrating the shared circuit architecture of the RC oscillator 100 shown in FIG. 1 according to another embodiment of the present invention. A current mirror circuit 310, a comparator circuit 320, and a bias voltage generator 330 shown in FIG. 3 may be taken as examples of the current mirror circuit 110, the comparator circuit 120, the bias voltage generator 130, and the clock buffer 140 shown in FIG. 1, respectively, wherein the clock buffer 240 in the architecture shown in FIG. 3 may be the same as the clock buffer 240 in the architecture shown in FIG. 2.

The current mirror circuit 310 may include the first corresponding transistor located on the first current path, such as the transistor P1, wherein the first terminal of the first corresponding transistor (e.g. the drain terminal of the transistor P1) is coupled to the first transistor (e.g. the transistor N1), and is coupled to the gate terminal of the first corresponding transistor (e.g. the gate terminal of the transistor P1). The current mirror circuit 310 may further include the second corresponding transistor located on the second current path, such as the transistor P2, wherein the respective gate terminals of the first corresponding transistor and the second corresponding transistor (e.g. the transistors P1 and P2) may be coupled to each other. In addition, the comparator circuit 320 may include the first transistor (e.g. the transistors N1), the second transistor (e.g. the transistor N2), the resistor RES, and the capacitor CAP, and may further include the transistor N5, wherein the gate terminal of the transistor N5 is coupled to the output terminal OUT, and the other two terminals of the transistor N5 are coupled to the two terminals of the capacitor CAP, respectively. Compared with the comparator circuit 220 shown in FIG. 2, the comparator circuit 320 shown in FIG. 3 may include at least one additional connection toward the outside of the comparator circuit 320.

As shown in FIG. 3, the bias voltage generator 330 may share a part of the sub-circuits with the comparator circuit 320, and more particularly, may include the transistor N1 and the resistor RES of the comparator circuit 320, wherein the transistor N1 and the resistor RES are located on the first current path. In addition, the bias voltage generator 330 may further include an operation amplifier 332. A first input terminal and a second input terminal of the operation amplifier 332, such as a positive input terminal and a negative input terminal (for brevity, labeled as "+" and "−", respectively), are coupled to a bandgap voltage generator (not shown) and a node between the first transistor (e.g. the transistor N1) and the resistor RES, respectively, and respective gate terminals of the first transistor and the second transistor (e.g. the transistors N1 and N2) are coupled to an output terminal of the operation amplifier 332.

In addition, the bias voltage generator 330 may utilize the operation amplifier 3320 to receive a bandgap voltage generated by the bandgap voltage generator, for generating a comparator reference voltage VREF corresponding to the bandgap voltage. As a result, the bandgap voltage that is output to the first input terminal (e.g. the positive input terminal "+") of the operation amplifier 332 may also be labeled as "VREF", to indicate that the bandgap voltage may be the same as the comparator reference voltage VREF. For brevity, similar descriptions for this embodiment are not repeated in detail here.

According to some embodiments, the bias voltage generator 330 may further include the bandgap voltage generator. For brevity, similar descriptions for these embodiments are not repeated in detail here.

Figure 4:
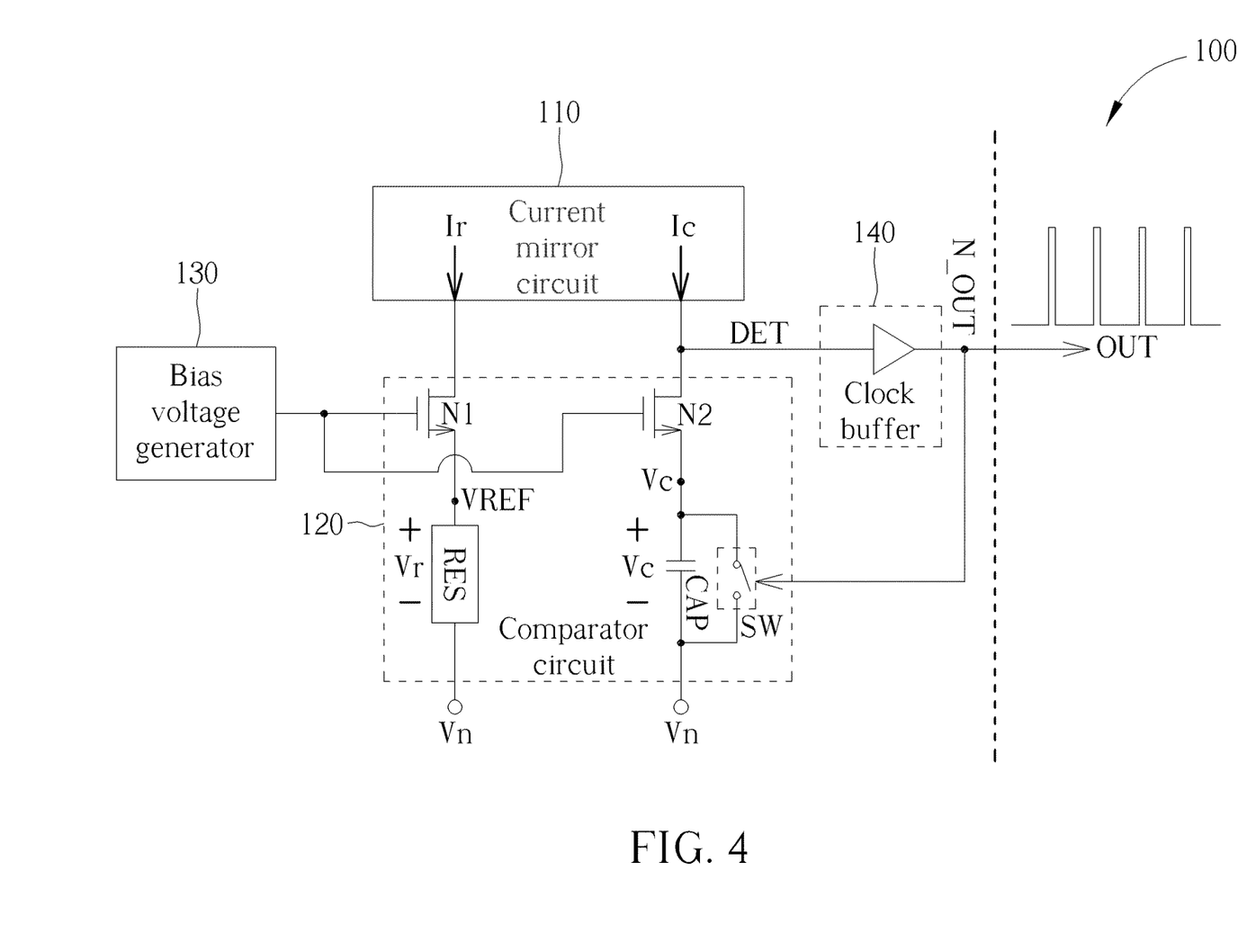
FIG. 4 is a diagram illustrating related voltages and currents controlled by the RC oscillator shown in FIG. 1 according to an embodiment of the present invention.

FIG. 4 is a diagram illustrating related voltages and currents controlled by the RC oscillator 100 shown in FIG. 1 according to an embodiment of the present invention. Currents Ir and Ic shown in FIG. 4 may be taken as examples of the first current and the second current, respectively. A voltage Vr of the resistor RES, such as a voltage between two terminals of the resistor RES, may be equal to a voltage difference (VREF-Vn) between the comparator reference VREF and the ground voltage Vn, and more particularly, may be equal to the comparator reference voltage VREF under the situation that Vn=0. For brevity, similar descriptions for this embodiment are not repeated in detail here.

Figure 5:
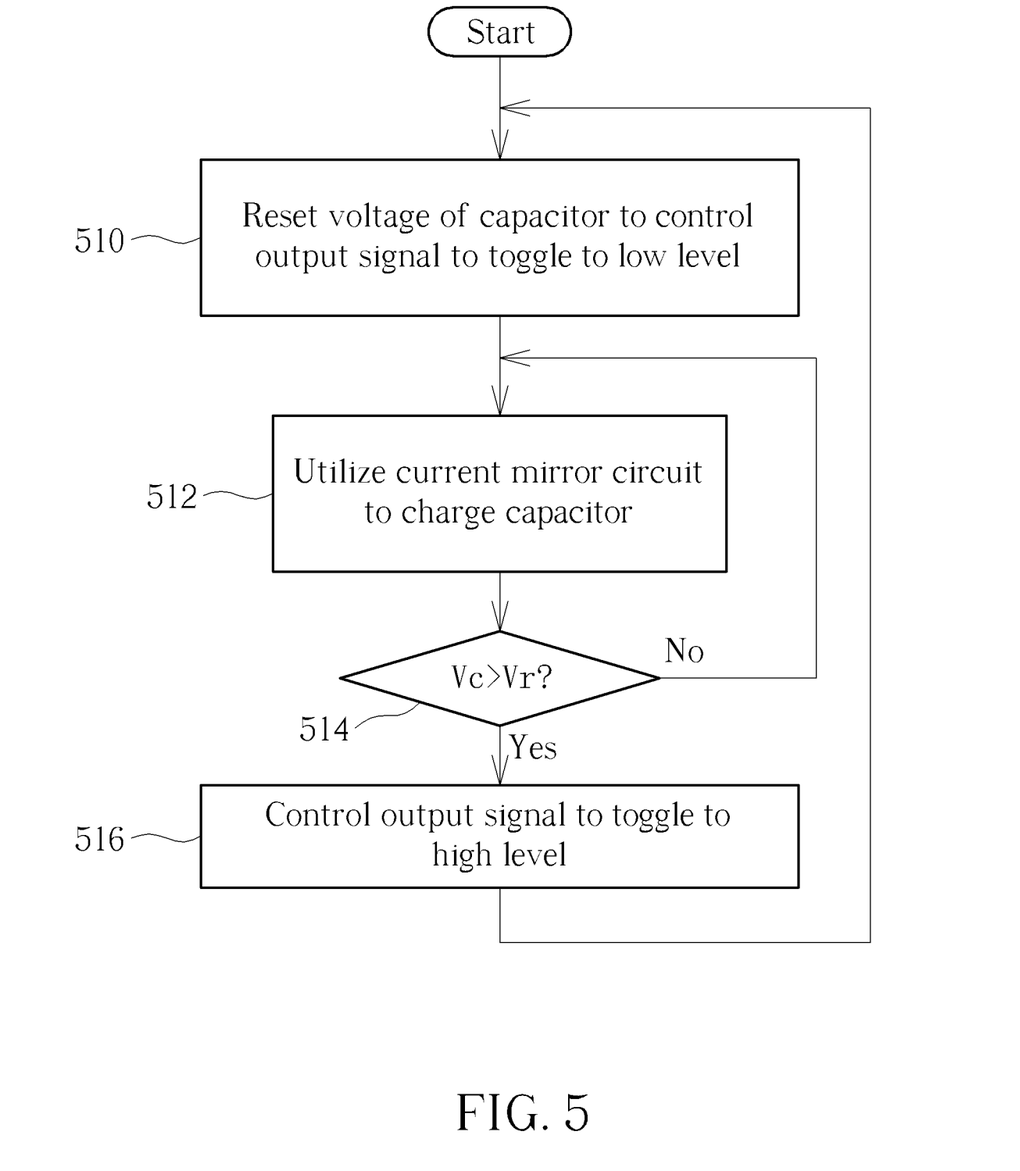
FIG. 5 is a working flow of the RC oscillator shown in FIG. 1 according to an embodiment of the present invention.

FIG. 5 is a working flow of the RC oscillator 100 shown in FIG. 1 according to an embodiment of the present invention.

In Step 510, the RC oscillator 100 may utilize the switch SW (e.g. the transistor N5) to reset the voltage Vc of the capacitor CAP, to control the output signal OUT to toggle to the low level. For example, when Step 510 is entered from Step 516, the output signal OUT toggles to the low level, but the present invention is not limited thereto. When Step 510 is entered for the first time, the capacitor CAP may not be charged yet, and therefore the voltage Vc may be equal to 0V (volt). Under this situation, the RC oscillator 100 may utilize the clock buffer 140, such as the clock buffer 240, to control the output signal OUT to be the low level by default.

In Step 512, the RC oscillator 100 may utilize the current mirror circuit 110, such as the current mirror circuit 210 or the current mirror circuit 310, to charge the capacitor CAP.

In Step 514, the RC oscillator 100 may utilize the capacitor circuit 120, such as the capacitor circuit 220 or the capacitor circuit 320, to check whether Vc is larger than Vr (i.e. Vc>Vr). If Yes, Step 516 is entered; if No, Step 512 is entered.

In Step 516, the RC oscillator 100 may utilize the clock buffer 140, such as the clock buffer 240, to control the output signal OUT to toggle to the high level.

For better comprehension, the operation method of the RC oscillator 100 may be illustrated with the working flow shown in FIG. 5, but the present invention is not limited thereto. According to some embodiments, one or more steps may be added, deleted, or changed in the working flow shown in FIG. 5.

Figure 6:
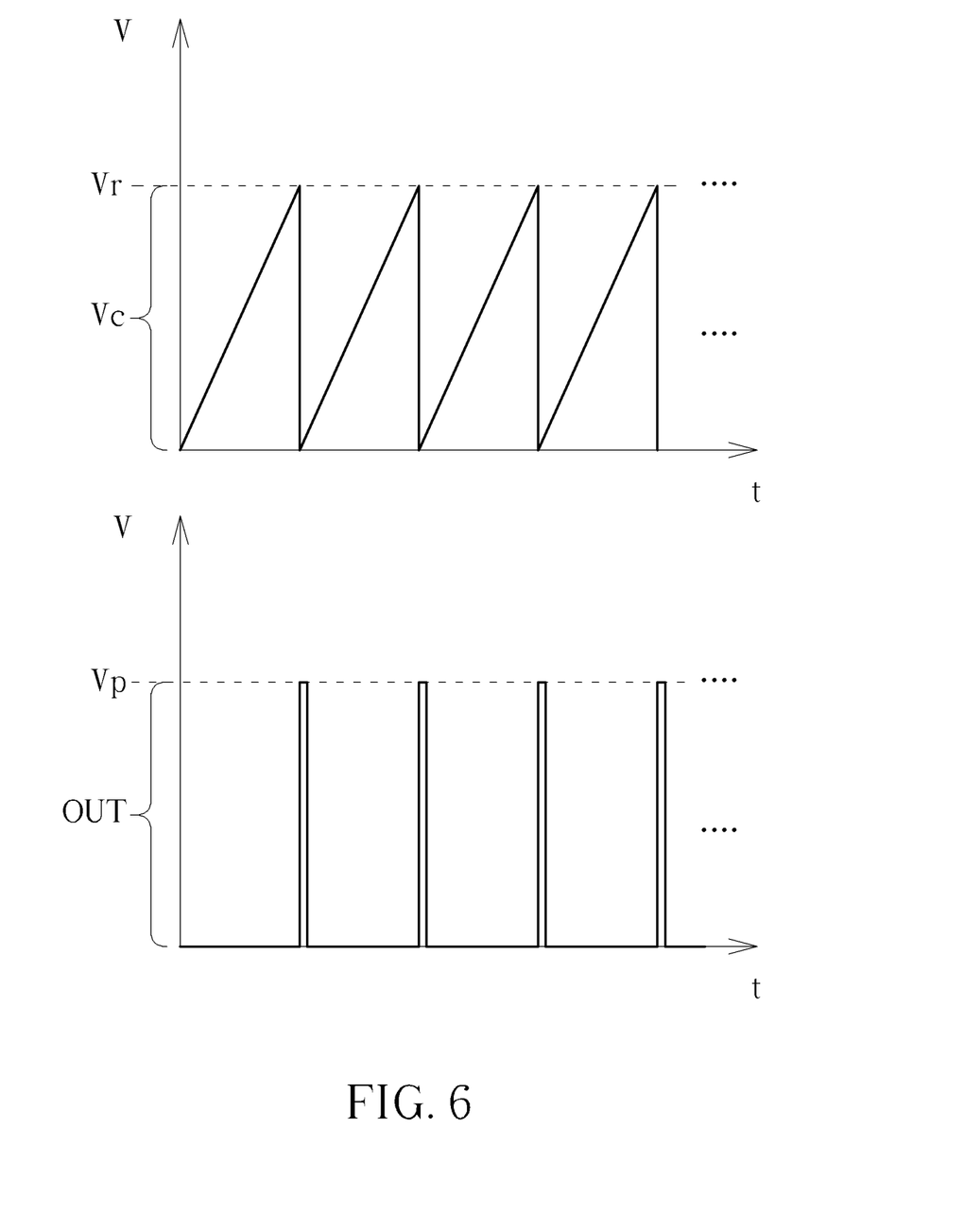
FIG. 6 is a timing diagram of related signals of the RC oscillator shown in FIG. 1 according to an embodiment of the present invention.

FIG. 6 is a timing diagram of related signals of the RC oscillator 100 shown in FIG. 1 according to an embodiment of the present invention, wherein the horizontal axis and the vertical axis may be indicative of time and voltage (labeled as "t" and "V"), respectively. As shown in the upper part of FIG. 6, the RC oscillator 100 may utilize the current mirror circuit 110 to charge the capacitor CAP so that the voltage Vc starts to increase from 0V (volt). As shown in the lower part of FIG. 6, when Vc>Vr, the RC oscillator 100 may utilize the clock buffer 140 to control the output signal OUT to toggle to the high level. Afterward, the RC oscillator 100 may utilize the switch SW to reset the voltage Vc of the capacitor CAP to become 0V (volt), as shown in the upper part of FIG. 6; and may utilize the clock buffer 140 to correspondingly control the output signal OUT to toggle to the low level, as shown in the lower part of FIG. 6. For brevity, similar descriptions for this embodiment are not repeated in detail here.

For better comprehension, in FIG. 6, the increase of the voltage Vc in any of the multiple cycles may be illustrated as a line segment, to indicate that the current mirror circuit 110 may charge the capacitor CAP very fast, but the invention is not limited thereto. According to some embodiments, the curves of related signals (e.g. the voltage Vc and the output signal OUT) may be changed.

In the above-mentioned embodiments, the bias voltage generator 130 (e.g. the bias voltage generator 230 and the bias voltage generator 330) may at least share the resistor RES located on the first current path with the comparator circuit 120 (e.g. the comparator circuit 220 and the comparator circuit 320). Since the resistor RES may occupy a significant chip area on a chip, the RC oscillator 100 with the above-mentioned shared circuit architecture may save the chip area of the chip without wasting additional chip area to set up any additional resistors. Compared with the traditional architecture, the RC oscillator 100 with the above-mentioned shared circuit architecture of the present invention may achieve an excellent overall performance without introducing a side effect or in a way that less likely to introduce aside effect, and more particularly, may achieve targets of low cost and high performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistor-capacitor (RC) oscillator with shared circuit architecture, comprising:
   a current mirror circuit, comprising:
      a plurality of transistors, coupled to a supply voltage, wherein the current mirror circuit is arranged to utilize the plurality of transistors to perform current control, to adjust a second current on a second current path according to a first current on a first current path;
   a comparator circuit, arranged to perform comparison operations, and comprising:
      a first transistor, coupled to the current mirror circuit, and located on the first current path;
      a second transistor, coupled to the current mirror circuit, and located on the second current path, wherein respective gate terminals of the first transistor and the second transistor are coupled to each other;
      a resistor, coupled to the first transistor, and located on the first current path; and
      a capacitor, coupled to the second transistor, and located on the second current path, wherein a comparison result signal generated by the comparator circuit corresponds to a voltage of the capacitor;
   a bias voltage generator, coupled to the comparator circuit, and arranged to generate a bias voltage as a comparator reference voltage between the first transistor and the resistor, wherein the bias voltage generator comprises:
      the first transistor and the resistor of the comparator circuit, located on the first current path;
      another transistor, located on a third current path, wherein respective gate terminals of the first transistor and the another transistor are coupled to each other;
      a first corresponding transistor in the plurality of transistors of the current mirror circuit, located on the first current path; and
      another corresponding transistor in the plurality of transistors of the current mirror circuit, located on the third current path, wherein respective gate terminals of the first corresponding transistor and the another corresponding transistor are coupled to each other; and
   a clock buffer, coupled to the comparator circuit, and arranged to buffer the comparison result signal to generate an output signal, wherein an output terminal of the clock buffer is arranged to output the output signal, and is coupled to the comparator circuit to provide the output signal to the comparator circuit, for selectively resetting the voltage of the capacitor.

2. The RC oscillator of claim 1, wherein the comparator circuit is arranged to selectively conduct two terminals of the capacitor according to the output signal.

3. The RC oscillator of claim 2, wherein the comparator circuit further comprises:
   a third transistor, wherein a gate terminal of the third transistor is coupled to the output terminal, and other two terminals of the third transistor are coupled to the two terminals of the capacitor, respectively.

4. The RC oscillator of claim 1, wherein another terminal of the another transistor is coupled to the another corresponding transistor, and is coupled to a gate terminal of the another transistor.

5. A resistor-capacitor (RC) oscillator with shared circuit architecture, comprising:
   a current mirror circuit, comprising:
      a plurality of transistors, coupled to a supply voltage, wherein the current mirror circuit is arranged to utilize the plurality of transistors to perform current control, to adjust a second current on a second current path according to a first current on a first current path;
   a comparator circuit, arranged to perform comparison operations, and comprising:
      a first transistor, coupled to the current mirror circuit, and located on the first current path;
      a second transistor, coupled to the current mirror circuit, and located on the second current path, wherein respective gate terminals of the first transistor and the second transistor are coupled to each other;
      a resistor, coupled to the first transistor, and located on the first current path; and
      a capacitor, coupled to the second transistor, and located on the second current path, wherein a comparison result signal generated by the comparator circuit corresponds to a voltage of the capacitor;
   a bias voltage generator, coupled to the comparator circuit, and arranged to generate a bias voltage as a comparator reference voltage between the first transistor and the resistor, wherein the bias voltage generator comprises:
      the first transistor and the resistor of the comparator circuit, located on the first current path; and
      an operation amplifier, wherein a first input terminal and a second input terminal of the operation amplifier are coupled to a bandgap voltage generator and a node between the first transistor and the resistor, respectively, and respective gate terminals of the first transistor and the second transistor are coupled to an output terminal of the operation amplifier; and a clock buffer, coupled to the comparator circuit, and arranged to buffer the comparison result signal to generate an output signal, wherein an output terminal of the clock buffer is arranged to output the output signal, and is coupled to the comparator circuit to provide the output signal to the comparator circuit, for selectively resetting the voltage of the capacitor.

6. The RC oscillator of claim 5, wherein the bias voltage generator is arranged to utilize the operation amplifier to receive a bandgap voltage generated by the bandgap voltage generator, to generate the comparator reference voltage corresponding to the bandgap voltage.

7. The RC oscillator of claim 5, wherein the plurality of transistors of the current mirror circuit comprise:
- a first corresponding transistor, located on the first current path, wherein a first terminal of the first corresponding transistor is coupled to the first transistor, and is coupled to a gate terminal of the first corresponding transistor; and
- a second corresponding transistor, located on the second current path, wherein respective gate terminals of the first corresponding transistor and the second corresponding transistor are coupled to each other.

* * * * *